(12) United States Patent
Christensen et al.

(10) Patent No.: US 7,782,691 B2
(45) Date of Patent: Aug. 24, 2010

(54) APPARATUS FOR GUARANTEED WRITE THROUGH IN DOMINO READ SRAM'S

(75) Inventors: Todd A. Christensen, Rochester, MN (US); Elizabeth L. Gerhard, Rochester, MN (US); Travis R. Hebig, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 357 days.

(21) Appl. No.: 11/936,139

(22) Filed: Nov. 7, 2007

(65) Prior Publication Data

US 2009/0116324 A1    May 7, 2009

(51) Int. Cl.
*G11C 7/00* (2006.01)
(52) U.S. Cl. .................. 365/203; 365/189.05; 365/194; 365/195
(58) Field of Classification Search .................. 365/203, 365/194, 195, 189.08, 189.05
See application file for complete search history.

(56) References Cited

U.S. PATENT DOCUMENTS

| | | | |
|---|---|---|---|
| 5,831,452 A * | 11/1998 | Nowak et al. .................. 326/98 |
| 6,150,834 A * | 11/2000 | Ciraula et al. .................. 326/21 |
| 6,657,886 B1 * | 12/2003 | Adams et al. .................. 365/154 |
| 6,901,003 B2 | 5/2005 | Adams et al. |
| 7,352,650 B2 | 4/2008 | Yokoyama |
| 7,385,865 B2 | 6/2008 | Khellah et al. |
| 7,495,949 B2 | 2/2009 | Buettner et al. |
| 7,502,276 B1 | 3/2009 | Behrends et al. |
| 7,576,568 B1 * | 8/2009 | Tran .......................... 326/121 |

* cited by examiner

*Primary Examiner*—Richard Elms
*Assistant Examiner*—Hien N Nguyen
(74) *Attorney, Agent, or Firm*—Bockhop & Associates, LLC

(57) ABSTRACT

In a digital device for facilitating recovery of a precharged dot line, periodically precharged by a precharge signal, that has been prematurely discharged as a result of an early read condition, a data input signal can have a selected one of a first value and a second value. The first value is a value that would be reflected by the dot line being in a charged state. A logic device that is responsive to the data input signal causes charge to be applied to the dot line when the data signal has the first value.

3 Claims, 3 Drawing Sheets

APPARATUS FOR GUARANTEED WRITE THROUGH IN DOMINO READ SRAM'S

CROSS-REFERENCE TO RELATED APPLICATION(S)

This application is related to a commonly-owned and related application entitled "Method and Apparatus for Selectable Guaranteed Write Through," invented by Peter T. Freiburger, et al., and having Ser. No. 11/936,877.

BACKGROUND OF THE INVENTION

1. Field of the Invention

The present invention relates to digital circuits and, more specifically to a domino read static random access memory.

2. Description of the Prior Art

Static random access memory (SRAM) is a type of volatile digital memory that retains data written to it so long as power is applied to the SRAM. One type of SRAM commonly used in high performance computational circuits is referred to as a "domino-read" SRAM. A domino-read SRAM can have write-though capability that allows a value being written into the SRAM to be read at the output of the SRAM in the same cycle that the value is being written. This feature is useful while performing memory and logic self tests.

When testing integrated circuits, techniques such as ABIST (Array Built In Self Test) and LBIST (Logic Built In Self Test) are used to test memory arrays (such as SRAM arrays) and logic elements. It is very important to be able test the full latch to latch paths that are used in the chip function at the same frequency that will be used in the system application. If the circuits are tested at a slower frequency or part of the functional path is bypassed, then there could be delay defects that would not be caught by test but result in a failing chip when exercised in the system. This is a very expensive point to find and screen out failing parts.

In some cases, arrays are designed to be latch bounded. There are latches at all the address and data input pins and latches at the data output pins. The array typically would have 1 clock cycle to perform a read access and have the data captured in the output latch. The data outputs would be launched out of the array on the subsequent cycle. In other cases, arrays do not have an output latch and logic is placed after the array data outputs and downstream capture latches.

ABIST testing of the arrays is very straightforward when testing latch bounded arrays. A typical existing non-latch bounded ABIST testing arrangement 10 is shown in FIG. 1. In the case of latch-bounded arrays, ABIST testing will test the entire path and if ABIST is run at system speed, delay defects will be caught. However, for arrays that are not output latch bounded, observation latches can be placed on the outputs so that ABIST testing is straightforward. Unfortunately, ABIST is not testing the full path since the downstream logic is not tested along with the array path. It is important to test the full latch to latch path that includes arrays and logic.

A typical domino read SRAM array is shown in FIG. 2. The SRAM includes a plurality of cells 20 that are each accessed by asserting a word line 14. Each of the SRAM cells 20 includes a pair of cross-coupled inverters 24 that maintain a current state between a pair of isolating transistors 22 that are allowed to conduct if the word line 14 is asserted. Asserting the word line 14 allows the inverters 24 to accept a new data value from a write line 16 (referred to as "WT_B") or write line WC 18 and to put its data on a BLC bit line 28 and BLT bit line 26.

A local evaluation circuit 40 is used to condition data being written to and read from the SRAM cell 20. The local evaluation circuit 40 (referred to as "LOCAL EVAL") includes a top half 42 and a bottom half 60, which are reflected copies of each other. (For the sake of simplicity, only the top half 42 is shown in detail herein.) Each half includes circuitry used to precharge a BLC line 26 and BLT line 28 used to write to or read from the SRAM cell 20. The circuitry includes a local precharge line 44 that couples a first PFET 46 to a voltage source and decouples the BLC line 26 when a low voltage is applied thereto, thereby causing the BLC line 26 to be precharged when not being accessed. During a write, the local precharge line 44 is raised, thereby decoupling the voltage source at PFET 46 and coupling the BLC line 26 to the write line 16 through NFET 48. This causes PFET 56 to enter into a conducting state (which indicates that a logic "1" is being written to the SRAM 20). On the other hand, if the local precharge line 44 has a high value and if the compliment of the write line 18 (referred to as "WC") has a high value, then both NFET 52 and NFET 54 will conduct, allowing bit line 28 to begin discharging. Also, when the local precharge line 44 has a low value, a second PFET 50 couples the voltage source to the bit line 28 and prevents the bit line 28 from discharging by turning off a first NFET 52, thereby precharging the bit line 28, resulting in NAND gate 70 turning off NFET 72 when write line 16 has a low value.

Data is read from a precharged dot line 30. A global precharge signal 34 is coupled to the gate of a PFET 36 so that when the global precharge signal 34 has a low value, the PFET 36 couples the voltage source to the dot line 30. A charge maintenance circuit 32 may also be employed to maintain a precharged condition of the dot line 30.

In most cases, a new value being written to the SRAM 20 will appear on the dot line 30 as it is being written to the SRAM 20, thus giving this circuit its "write-through" capability. In one case, referred to as an "early read" condition, where a "1" is being written to the SRAM 20 to overwrite a "0" currently stored therein, if the "0" driven by SRAM 20 on bit line 28 causes NAND gate 70 to output a "1" before PFET 56 is turned "on" by a "0" placed on write line 16, then NFET 72 will begin to conduct, thereby discharging dot line 30. This discharge will be impossible to recover from until the next cycle, thereby resulting in an incorrect value being read on the dot line 30 during the "write-through."

Therefore, there is a need for an SRAM with a write-through capability that is capable of maintaining precharge on the dot line when a "0" is stored in the SRAM, but when a "1" is being written to the SRAM.

SUMMARY OF THE INVENTION

The disadvantages of the prior art are overcome by the present invention which, in one aspect, is a digital device for facilitating recovery of a precharged dot line, periodically precharged by a precharge signal, that has been prematurely discharged as a result of an early read condition. A data input signal can have a selected one of a first value and a second value. The first value is a value that would be reflected by the dot line being in a charged state. A logic device that is responsive to the data input signal causes charge to be applied to the dot line when the data signal has the first value.

In another aspect, the invention is a static random access memory with write-through capability, in which a memory cell is configured to store a bit of data. An enable signal is configured to enable writing a value from an input into the memory cell and to enable reading a value from the memory cell onto a dot line. A write-through circuit is configured to allow a value being written into the memory cell to be read at the dot line in a single clock cycle. A precharge circuit is configured to precharge the dot line to a predetermined value when the dot line is not being accessed. A logic device is configured to precharge the dot line when a current state of the memory cell and a current value of the input causes the dot line to discharge prematurely and when the current state of the input corresponds to a state in which the dot line should be charged.

In yet another aspect, the invention is a method of ensuring that a precharged dot line, that is coupled to an output from an static random access memory cell having a write-through capability, can recover from a premature discharge. The static random access memory is configured to store a value indicated by a data input signal and including a precharge circuit that causes the dot line to be precharged when a precharge signal is asserted. A charge signal is asserted onto the dot line when either the precharge signal has been asserted or the data input signal has a value that would cause the static random access memory cell to store a logical "1." The dot line is coupled to a charge source when the charge signal is asserted.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

BRIEF DESCRIPTION OF THE FIGURES OF THE DRAWINGS

FIG. 3 is a schematic diagram of an embodiment of an SRAM device employing a guaranteed write through.

DETAILED DESCRIPTION OF THE INVENTION

Figure 1:
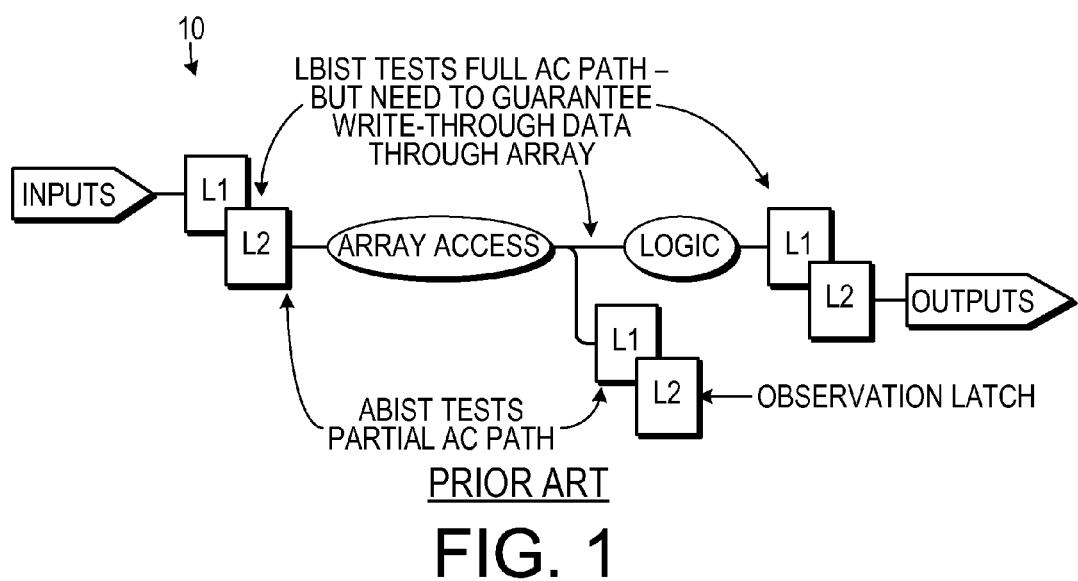
FIG. 1 is a block diagram of a prior art ABIST testing arrangement.
Figure 2:
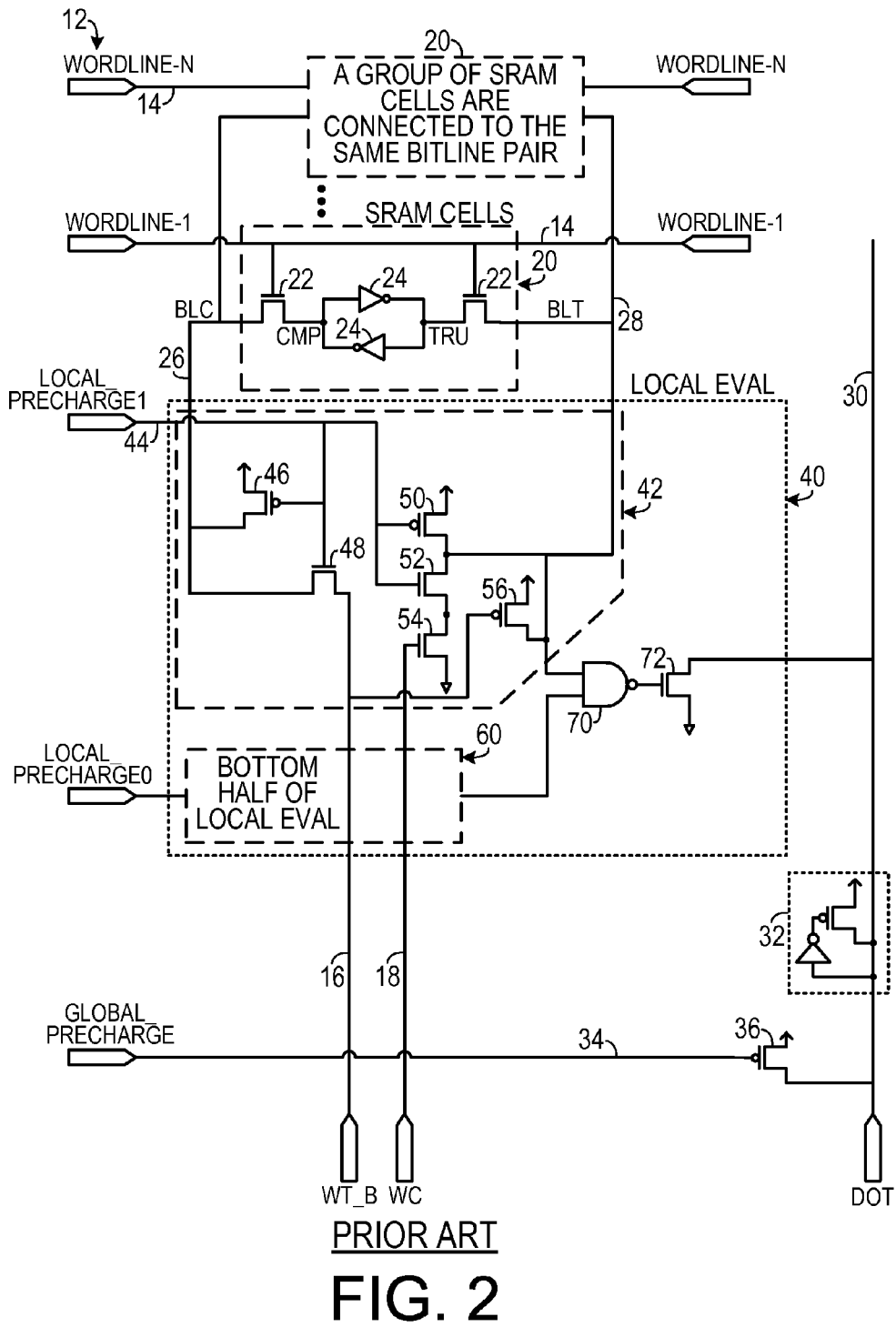
FIG. 2 schematic diagram of a prior art SRAM device.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 3:
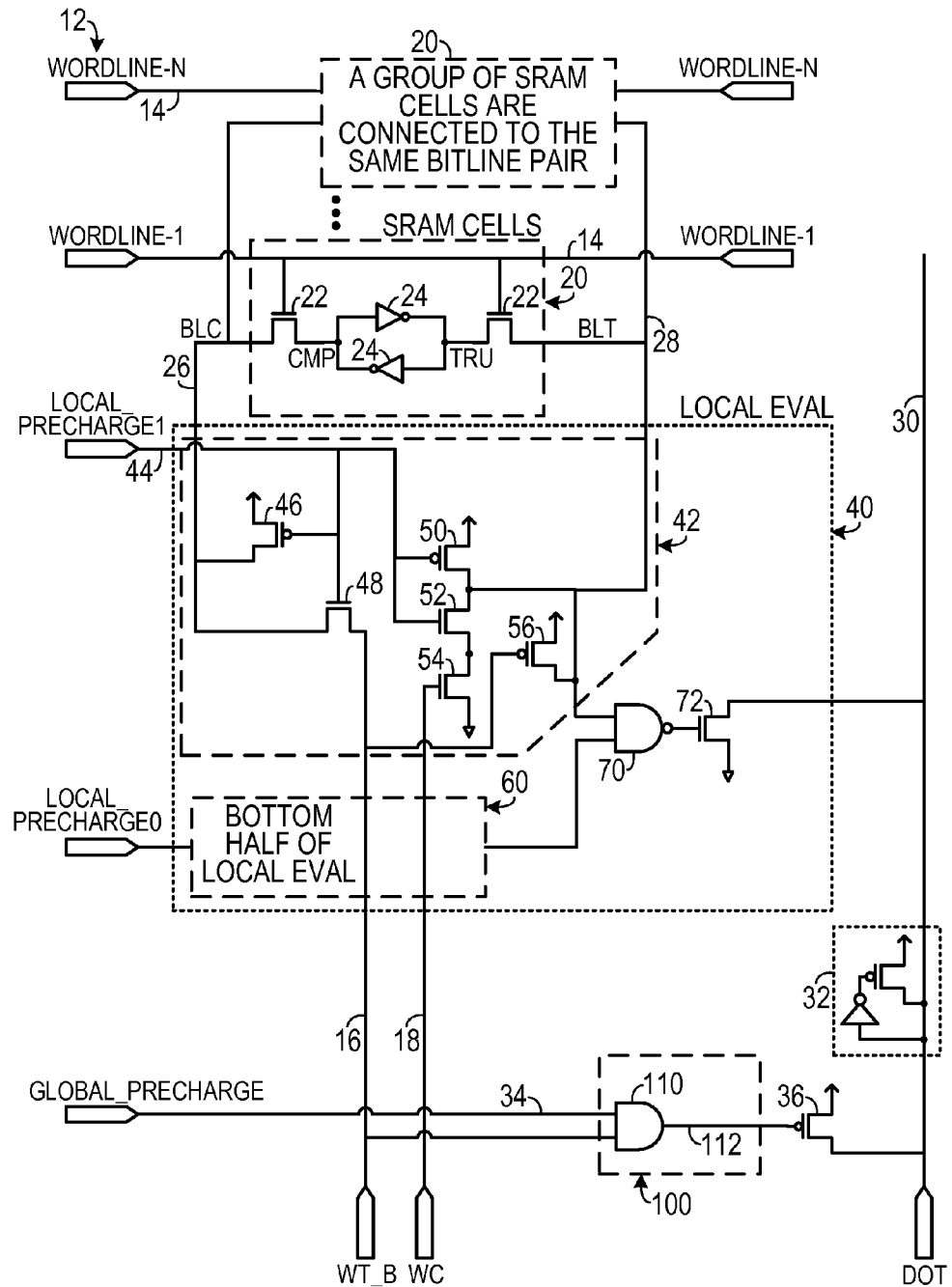

As shown in FIG. 3, in one embodiment a plurality of SRAM cells 20 are each coupled to a word line 14. Each of the SRAM cells 20 includes a pair of cross-coupled inverters 24 between a pair of isolating transistors 22. Data from the SRAM cell 20 is output on bit line 28. Typically, there are 16 SRAM cells 20 per bit line.

The local evaluation circuit 40, which includes a top half 42 and a reflected copy bottom half 60, is coupled to the SRAM cell 20. (Again, for the sake of simplicity, only the top half 42 is shown in detail herein.) Each half includes circuitry used to precharge a BLC line 26 and bit line 28 coupled to the SRAM cell 20 and includes a local precharge line 44 coupled to a first PFET 46. The BLC line 26 is coupled to the data on line WT_B 16 through NFET 48 when PFET 46 is in a nonconducting state. Also, when the local precharge line 44 drives a second PFET 50 and first NFET 52, which controls the state of NAND gate 70. NAND gate 70 controls the state of NFET 72, which selectively discharges dot line 30. Write line 18 drives NFET 54, which is also coupled to NAND gate 70 when NFET 52 is in a conducting state and effectively writing a "0."

A global precharge signal 34 is coupled to the gate of a PFET 36 through guaranteed write through circuit 100. PFET 36 selectively precharges the dot line 30. A charge maintenance circuit 32 may also be employed to maintain a precharged condition of the dot line 30.

To prevent the dot line 30 from discharging prematurely during an early read, a guaranteed write through circuit 100 is added to the global precharge line 34. The guaranteed write through circuit 100 ensures that PFET 36 is in a conducting state (i.e., charging dot line 30) whenever either the global precharge line 34 is in a precharging state or the write line 16 is in a state that would result in a "1" being written to the SRAM 20. In one embodiment, the guaranteed write through circuit 100 includes an AND gate 110 having the global precharge line 34 and the write line 16 as inputs. The output 112 of the AND gate 110 will be a logical "0" when either of these two inputs has a value corresponding to a "0" (which is the case if either precharging is occurring or if a "1" is being written to the SRAM 20). When the output of the AND gate 110 is a "0," the PFET 36 will couple the dot line 30 to the voltage source, causing the dot line 30 to be in a charged state.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A static random access memory with write-through capability, comprising:
   a. a memory cell configured to store a bit of data;
   b. an enable signal configured to enable writing a value from an input into the memory cell and to enable reading a value from the memory cell onto a dot line;
   c. a write-through circuit configured to allow a value being written into the memory cell to be read at the dot line in a single clock cycle;
   d. a precharge circuit configured to precharge the dot line to a predetermined value when the dot line is not being accessed; and
   e. a logic device configured to recharge the dot line when a current state of the memory cell and a current value of the input causes the dot line to discharge prematurely and when the current state of the input corresponds to a state in which the dot line should be charged.

2. The static random access memory of claim 1, wherein the logic device comprises:
   a. a transistor having a source coupled to a voltage source, a drain coupled to the dot line and a gate;
   b. a logic gate, responsive to the precharge signal and to the data input signal and coupled to the gate of the transistor, the logic gate configured to assert a signal onto the gate of the transistor so as to cause the transistor to conduct from the source to the drain when either the precharge signal or the data input signal is in a state corresponding to the dot line being in a charged state.

3. The static random access memory of claim 2, wherein the transistor comprises a p-type field effect transistor and wherein the logic gate comprises an AND gate, the precharge signal having a logic "0" state when the dot line is to be precharged and the data input signal having a logic "0" state when a logic "1" is to be written to the dot line.

* * * * *